US012772568B2

(12) United States Patent
Gao et al.

(10) Patent No.: US 12,772,568 B2
(45) Date of Patent: Oct. 20, 2026

(54) METHOD FOR IMPROVING FDSOI DEVICE LEAKAGE

(71) Applicant: Shanghai Huali Integrated Circuit Corporation, Shanghai (CN)

(72) Inventors: Xing Gao, Shanghai (CN); Yan Li, Shanghai (CN); Tao Wang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 358 days.

(21) Appl. No.: 18/654,226

(22) Filed: May 3, 2024

(65) Prior Publication Data

US 2025/0006743 A1 Jan. 2, 2025

(30) Foreign Application Priority Data

Jun. 29, 2023 (CN) ......................... 202310786095.3

(51) Int. Cl.

| | |
|---|---|
| ***H10D 87/00*** | (2026.01) |
| ***H10P 90/00*** | (2026.01) |
| ***H10W 10/00*** | (2026.01) |
| ***H10W 10/10*** | (2026.01) |
| ***H10W 10/17*** | (2026.01) |

(52) U.S. Cl.
CPC ......... *H10D 87/00* (2025.01); *H10P 90/1906* (2026.01); *H10W 10/014* (2026.01); *H10W 10/061* (2026.01); *H10W 10/17* (2026.01); *H10W 10/181* (2026.01)

(58) Field of Classification Search
CPC .. H10D 87/00; H10P 90/1906; H10W 10/014; H10W 10/061; H10W 10/17; H10W 10/181
See application file for complete search history.

(56) References Cited

U.S. PATENT DOCUMENTS

| | | | | |
|---|---|---|---|---|
| 6,972,478 B1 * | 12/2005 | Waite | H10D 62/405 257/E21.633 |
| 12,308,281 B2 * | 5/2025 | Chen | H10P 50/242 |
| 12,400,908 B2 * | 8/2025 | Chen | H10D 86/01 |
| 2007/0048975 A1 * | 3/2007 | Chen | H10D 84/0167 257/E21.633 |
| 2008/0248615 A1 * | 10/2008 | Sleight | H10D 86/01 257/E21.409 |

(Continued)

*Primary Examiner* — Dao H Nguyen
(74) *Attorney, Agent, or Firm* — Banner & Witcoff, Ltd.

(57) ABSTRACT

The present disclosure provides a method for improving an FDSOI device leakage, including steps of: defining a bulk silicon region on the semiconductor structure, and forming an recess area by removing a silicon nitride layer, a first oxide layer, an SOI layer, and a buried oxide layer in the bulk silicon region by etch, wherein the etch is stopped at the silicon substrate; refilling the recess area in the bulk silicon region with monocrystalline silicon, until the monocrystalline silicon reaches a same height as that of the SOI layer outside of the bulk silicon region; forming an STI region, and performing ion implantation on the bulk silicon region; and forming a device structure in the bulk silicon region. In the present disclosure, a doping condition for the bulk silicon region is selected to meet the demands of the device, thereby solving the problem of the device leakage.

8 Claims, 4 Drawing Sheets

(56) References Cited

U.S. PATENT DOCUMENTS

| | | | | |
|---|---|---|---|---|
| 2008/0265362 | A1* | 10/2008 | Tigelaar ................. | H10D 86/01<br>257/504 |
| 2012/0231606 | A1* | 9/2012 | Nguyen ................. | H10D 86/01<br>257/E21.546 |
| 2018/0090386 | A1* | 3/2018 | Faul ................... | H10D 30/6748 |

* cited by examiner

METHOD FOR IMPROVING FDSOI DEVICE LEAKAGE

CROSS-REFERENCE TO RELATED APPLICATIONS

This application claims priority to Chinese patent application No. 202310786095.3, filed on Jun. 29, 2023, the disclosure of which is incorporated herein by reference in its entirety.

TECHNICAL FIELD

The present disclosure relates to the technical field of semiconductors, and in particular, to a method for improving a Fully Depleted Silicon-on-Insulator (FDSOI) device leakage.

BACKGROUND

The bulk silicon planar transistors (Bulk CMOS) have become inapplicable at the 20 nm node, because they are unable to achieve advantages in performance as cost and power consumption scaled down at equal proportions. FDSOI and FinFET are two approaches for continuing the downward expansion of the technology nodes. The FDSOI has the following advantages: it may improve a potential barrier, reduce a short-channel effect, improve a subthreshold characteristic of the device, and reduce static power consumption; as requiring no channel doping, FDSOI may avoid effects such as Random Doping Fluctuation (RDF), so an FDSOI device has a smaller threshold voltage Vt variation, in addition, by adjusting a back gate voltage flexibly, an FDSOI device performs at a wider dynamic range. The fabrication process of FDSOI devices is compatible with bulk silicon, further it has lower process complexity and less process steps than making FinFET devices in bulk silicon. For better integrating with the existing production line, the metal gate-last technology is adopted, whereby a silicon deposition solution is introduced to address a height difference in a bulk silicon region. However, a device such as a laterally-diffused metal-oxide semiconductor (LDMOS) in the bulk silicon region (silicon backfill region) in the existing process is subjected to an abnormal off-current leakage Ioff.

BRIEF SUMMARY

The present disclosure provides a method for improving the abnormal off-current leakage of an FDSOI device.

The method at least includes the following steps:

step 1, providing a semiconductor structure, wherein the semiconductor structure includes: a silicon substrate, and a buried oxide layer, a silicon-on-insulator (SOI) layer, a first oxide layer, and a silicon nitride layer, all of which are formed sequentially from bottom to top on the silicon substrate;

step 2, defining a bulk silicon region on the semiconductor structure, and forming a recess area in the bulk silicon region by removing the silicon nitride layer, the first oxide layer, the SOI layer, and the buried oxide layer in the bulk silicon region by etch, wherein the etch is stopped at the silicon substrate;

step 3, refilling the recess area in the bulk silicon region with monocrystalline silicon, until the monocrystalline-filled bulk silicon reaches the same height as that of the SOI layer at a side of the bulk silicon region, wherein after the filling of the monocrystalline silicon, removing the silicon nitride layer and the first oxide layer outside the bulk silicon region at the side of the monocrystalline silicon;

step 4, forming STI (shallow trench isolation) regions inside the non-bulk silicon region and at a border between the non-bulk silicon region and the bulk silicon region; and performing ion implantation on the bulk silicon region; and step 5, forming a device structure in the bulk silicon region.

In an example, the bulk silicon region is defined and patterned on the semiconductor structure in step 2 by means of photolithography.

In an example, a method of defining the bulk silicon region in step 2 is: applying a layer of photoresist on the semiconductor structure by spin-coating, followed by exposure and development, wherein the photoresist on an upper surface of the semiconductor structure that is defined as the bulk silicon region is removed, and the photoresist on the upper surface of the semiconductor structure in the non-bulk silicon region is retained.

In an example, a method of removing the silicon nitride layer, the first oxide layer, the SOI layer, and the buried oxide layer in the bulk silicon region by etch in step 2 is: etching the silicon nitride layer, the first oxide layer, the SOI layer, and the buried oxide layer sequentially downward along the upper surface of the semiconductor structure that is not covered by the photoresist.

In an example, the filling of the monocrystalline silicon in step 3 is performed in a manner of backfilling with selective non-doped intrinsic silicon.

In an example, a method of forming the STI regions in step 4 further includes: forming a first trench in the non-bulk silicon region and a second trench at the border between the non-bulk silicon region and the bulk silicon region; forming a second oxide layer on a surface of the SOI layer in the non-bulk silicon region, and on the surface of the monocrystalline silicon in the bulk silicon region; and filling the first and the second trenches with a silicon oxide material to form the STI regions.

In an example, a dose of the ion implantation on the bulk silicon region in step 4 is in a range of 5E11-5E13, and implantation energy is in a range of 5 KEV-30 KEV.

In an example, in step 4, the STI region is formed first, followed by performing the ion implantation on the bulk silicon region.

In an example, in step 4, the ion implantation is performed on the bulk silicon region first, followed by forming the STI region.

In an example, devices formed in the bulk silicon region in step 5 includes one or more of an LDMOS, a diode, a resistor, a capacitor, and a substrate pick-up structure.

As stated above, the method for improving an FDSOI device leakage of the present disclosure has the following beneficial effects: in the present disclosure, a doping condition for the bulk silicon region is selected to meet the demands of the device, thereby solving the problem of the device leakage.

DETAILED DESCRIPTION OF THE DISCLOSURE

The embodiments of the present disclosure are described below using specific examples, and those skilled in the art could readily understand other advantages and effects of the present disclosure from the contents disclosed in the description. The present disclosure can also be implemented or applied using other different specific implementations, and various details in the description can also be modified or changed based on different viewpoints and applications without departing from the spirit of the present disclosure.

Referring to FIG. 1 to FIG. 7. It should be noted that the drawings provided in the embodiments are only used to illustrate the basic concept of the present disclosure in a schematic way, so the drawings only show the components related to the present disclosure rather than being drawn according to the number, shape, and size of the components in actual implementations. The type, number, and proportion of various components can be changed randomly in the actual implementations, and the layout of the components may be more complicated.

Figure 7:
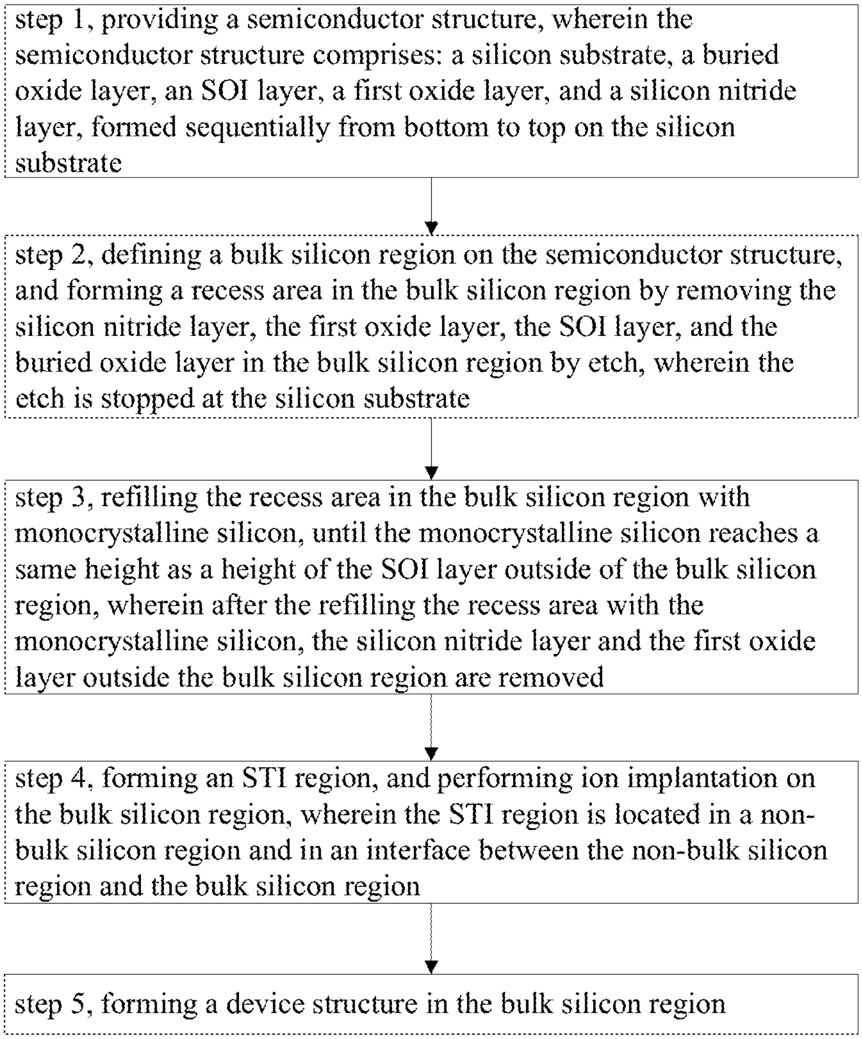
FIG. 7 is a flowchart of the steps in the method for improving an FDSOI device leakage of according to the present disclosure.

The present disclosure provides a method for improving an FDSOI device leakage. FIG. 7 is a flowchart showing the steps in the method for improving an FDSOI device leakage of the present disclosure, at least including the following steps.

Figure 1:
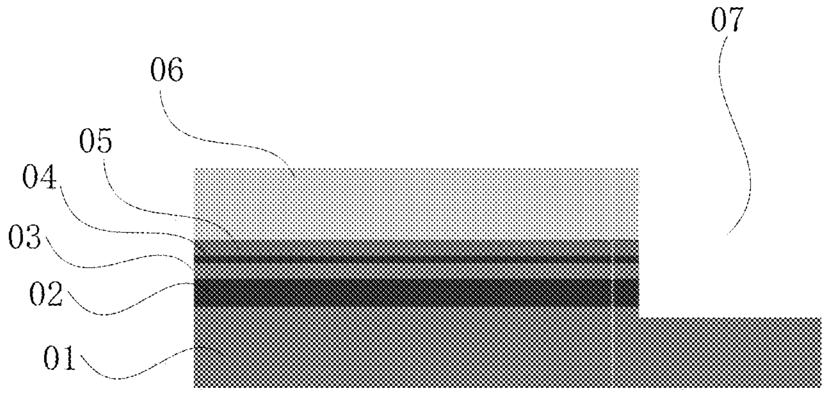
FIG. 1 to FIG. 5 are schematic diagrams of device structures formed in each of the steps of a method which improves an FDSOI device leakage according to the present disclosure.

Step 1. Provide a semiconductor structure, where the semiconductor structure includes: a silicon substrate, and a buried oxide layer, an SOI layer, a first oxide layer, and a silicon nitride layer, formed sequentially from bottom to top on the silicon substrate. Referring to FIG. 1, the semiconductor structure in step 1 includes: the silicon substrate 01, and the buried oxide layer 02, the SOI layer 03, the first oxide layer 04, and the silicon nitride layer 05 formed sequentially from bottom to top on the silicon substrate 01.

Step 2. Define a bulk silicon region on the semiconductor structure, and forming a recess area in the bulk silicon region by etching the silicon nitride layer, the first oxide layer, the SOI layer, and the buried oxide layer in the bulk silicon region, where the etch is stopped at the silicon substrate. Referring to FIG. 1, in step 2, the bulk silicon region is defined on the semiconductor structure, the silicon nitride layer 05, the first oxide layer 04, the SOI layer 03, and the buried oxide layer 02 in the bulk silicon region are removed by etch, where the etch is stopped at the silicon substrate 01. The etch stop layer may be the upper surface of the silicon substrate 01, or the etch may be stopped after the silicon substrate is etched by a pre-determined thickness.

Furthermore, in this embodiment of the present disclosure, the bulk silicon region is defined on the semiconductor structure in step 2 by means of photolithography.

Furthermore, in this embodiment of the present disclosure, referring to FIG. 1, a method of defining the bulk silicon region in step 2 is: applying a layer of photoresist 06 on the semiconductor structure by spin-coating, followed by exposure and development, where the photoresist on an upper surface of the semiconductor structure that is defined as the bulk silicon region is removed, and the photoresist on the upper surface of the semiconductor structure in the non-bulk silicon region is retained.

Furthermore, in this embodiment of the present disclosure, a method of removing the silicon nitride layer, the first oxide layer, the SOI layer, and the buried oxide layer in the bulk silicon region by etch in step 2 is: etching the silicon nitride layer, the first oxide layer, the SOI layer, and the buried oxide layer sequentially downward along the upper surface of the semiconductor structure that is not covered by the photoresist, to form a recess which is the etched bulk silicon region 07.

Figure 2:
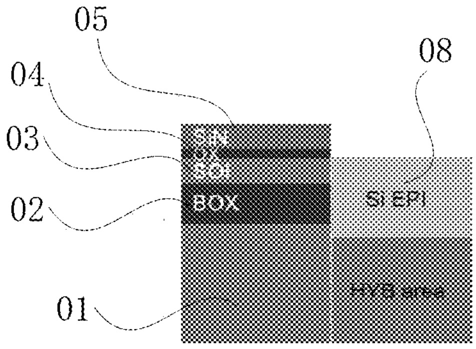
Figure 3:
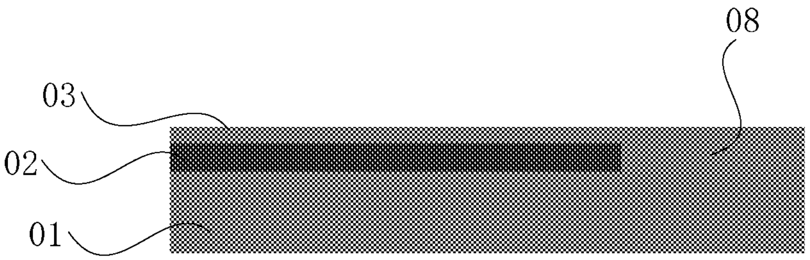

Step 3. Refill the recess area in the bulk silicon region with monocrystalline silicon, until the monocrystalline-filled bulk silicon reaches the same height as that of the SOI layer at a side of the bulk silicon region, wherein after the filling with the monocrystalline silicon, removing the silicon nitride layer and the first oxide layer outside the monocrystalline in the bulk silicon region at the side of the monocrystalline silicon. Referring to FIG. 2, in step 3, the recess in the bulk silicon region (the etched bulk silicon region 07 in FIG. 1) is filled with the monocrystalline silicon 08 (Si EPI), until the monocrystalline silicon reaches the same height as that of the SOI layer 03 (the SOI layer 03 in the non-bulk silicon region) at the side of the bulk silicon region. After the filling of the monocrystalline silicon, the silicon nitride layer 05 and the first oxide layer 04 in the non-bulk silicon region outside of the bulk silicon region are removed, resulting a structure formed as shown in FIG. 3.

Furthermore, in this embodiment of the present disclosure, the filling of the monocrystalline silicon in step 3 is performed in a manner of backfilling with selective non-doped intrinsic silicon.

Figure 4:
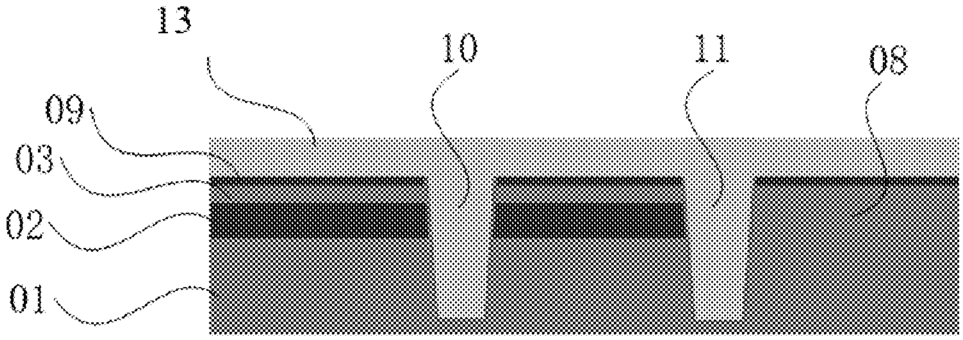
Figure 5:
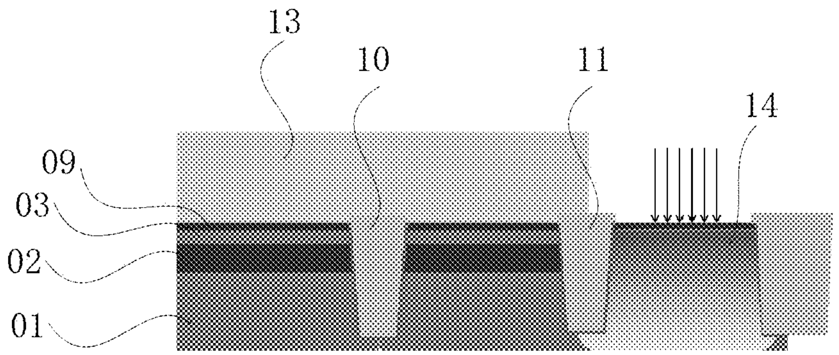

Step 4. Form STI regions, and perform ion implantation on the bulk silicon region, where one type of STI region is located within the non-bulk silicon region and another type of STI region is located between the non-bulk silicon region and the bulk silicon region. Furthermore, in this embodiment of the present disclosure, in step 4, the STI region is formed first, followed by performing the ion implantation on the bulk silicon region. Referring to FIG. 4, FIG. 4 is a schematic diagram of a structure where the STI region is formed in the present disclosure, and FIG. 5 is a schematic diagram of a structure where the ion implantation is performed on the bulk silicon region in the present disclosure. In other embodiments, in step 4, the ion implantation may be performed on the bulk silicon region first, followed by forming the STI region.

Furthermore, in this embodiment of the present disclosure, referring to FIG. 4, a method of forming the STI regions in step 4 includes: etching a first trench in the non-bulk silicon region and a second trench at the border between the non-bulk silicon region and the bulk silicon region; then forming a second oxide layer 09 on the surface of the SOI layer in the non-bulk silicon region, and on the monocrystalline silicon in the bulk silicon region, followed by filling the first and the second trenches with silicon oxide to form the STI regions, where the STI region 10 is formed in the non-bulk silicon region, and the STI region 11 is formed at the border between the non-bulk silicon region and the bulk silicon region.

Furthermore, in this embodiment of the present disclosure, a dose of the ion implantation on the bulk silicon region in step 4 is in a range of 5E11-5E13, and implantation energy is in a range of 5 KEV-30 KEV. Referring to FIG. 5, a method of performing the ion implantation on the bulk silicon region is: first forming a photoresist layer 13 to cover the bulk silicon region and the non-bulk silicon region, followed by exposing the bulk silicon region by means of photolithography, then performing the ion implantation on the exposed bulk silicon region to form the bulk silicon region 14 subjected to the ion implantation.

Step 5. Form a device structure in the bulk silicon region. That is, the device structure is formed in the bulk silicon region 14 subjected to the ion implantation.

Furthermore, in this embodiment of the present disclosure, devices formed in the bulk silicon region in step 5 includes one or more of an LDMOS, a diode, a resistor, a capacitor, and a substrate pick-up structure.

Figure 6:
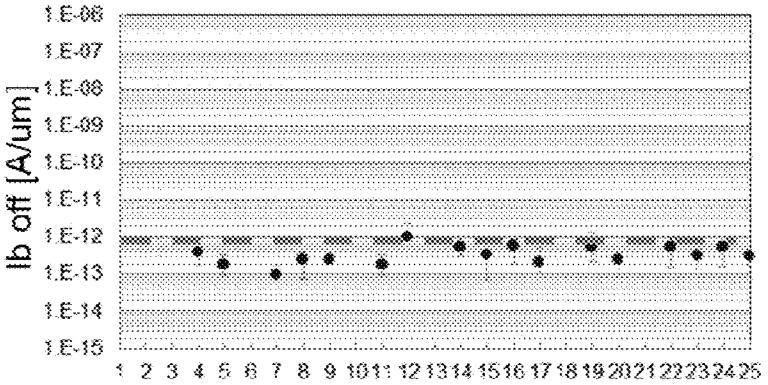
FIG. 6 is a chart showing the LDMOS leakage current Ib off from the first to the $25^{th}$ wafer in a lot.

A device failure mechanism in the conventional process is that, due to the use of intrinsic silicon in the current silicon backfill technology, diffusion occurs in subsequent processes following ion implantation of an N-well, a P-well etc., causing a failure of the intrinsic silicon and formation of uncontrollable doped silicon, resulting in a well failure and thereby forming a leakage. The present disclosure provides a more flexible solution to the problem. FIG. 6 is a chart showing the LDMOS leakage current Ib off from the first to the $25^{th}$ wafer in a test lot. Upon experiments, it is found that the method of the present disclosure can reduce the leakage current by 5 orders of magnitude.

To sum up, in the present disclosure, a doping condition for the bulk silicon region is selected to meet the demands of the device, thereby solving the problem of the device leakage. Therefore, the present disclosure effectively overcomes various defects in the prior art and has high industrial utilization value.

The above embodiments merely illustrate the principle and effect of the present disclosure, rather than limiting the present disclosure. Any person skilled in the art can modify or change the above embodiments without departing from the spirit and scope of the present disclosure. Therefore, all equivalent modifications or changes made by those with ordinary knowledge in the art without departing from the spirit and technical idea disclosed in the present disclosure shall still be covered by the claims of the present disclosure.

What is claimed is:

1. A method for improving a Fully Depleted Silicon-on-Insulator (FDSOI) device leakage, at least comprising:

step 1, providing a semiconductor structure, wherein the semiconductor structure comprises:

a silicon substrate, a buried oxide layer, a silicon-on-insulator (SOI) layer, a first oxide layer, and a silicon nitride layer, formed sequentially from bottom to top on the silicon substrate;

step 2, defining a non-bulk silicon region and a bulk silicon region on the semiconductor structure, wherein the defining the bulk silicon region on the semiconductor structure comprises forming by etching a recess area out of the semiconductor structure which includes a part of the silicon nitride layer, a part of the first oxide layer, a part of the SOI layer, a part of the buried oxide layer, and a part of the silicon substrate, wherein the etching is stopped at a pre-determined thickness in the silicon substrate, and wherein the non-bulk silicon region comprises areas outside of the recess area in the semiconductor structure;

step 3, refilling the recess area of the bulk silicon region on the semiconductor structure with monocrystalline silicon, until the monocrystalline silicon reaches a same height as a height of the SOI layer of the non-bulk silicon region, and removing the silicon nitride layer and the first oxide layer in the non-bulk silicon region;

step 4, forming a first shallow trench isolation (STI) region inside the non-bulk silicon region and a second STI region at a border between the non-bulk silicon region and the bulk silicon region; forming a photoresist layer over the bulk silicon region and the non-bulk silicon region, performing photolithography to expose the bulk silicon region and to keep the non-bulk silicon region covered by the photoresist layer; and performing ion implantation on the exposed bulk silicon region; and step 5, forming a device structure in the bulk silicon region after the ion implantation.

2. The method for improving the FDSOI device leakage according to claim 1, wherein the bulk silicon region is defined on the semiconductor structure in step 2 by means of photolithography.

3. The method for improving the FDSOI device leakage according to claim 2, wherein defining the bulk silicon region by means of photolithography in step 2 further comprises: applying a layer of photoresist on the semiconductor structure by spin-coating, followed by exposure and development, wherein photoresist on an upper surface of the semiconductor structure defining the bulk silicon region is removed, and photoresist on the upper surface of the semiconductor structure in the non-bulk silicon region is retained.

4. The method for improving the FDSOI device leakage according to claim 3, wherein in step 3, the refilling the recess area with the monocrystalline silicon further comprises performing backfilling with selective non-doped intrinsic silicon.

5. The method for improving the FDSOI device leakage according to claim 1, wherein in step 4, the forming the first STI region further comprises: forming a first trench in the non-bulk silicon region and forming a second trench at the border between the non-bulk silicon region and the bulk silicon region; forming a second oxide layer on a surface of the SOI layer in the non-bulk silicon region, and also on a surface of the monocrystalline silicon in the bulk silicon region; and filling the first trench with a silicon oxide material to form the first STI region, and filling the second trench with the silicon oxide material to form the second STI region.

6. The method for improving the FDSOI device leakage according to claim 1, wherein a dose of the ion implantation on the bulk silicon region in step 4 is in a range of 5E11-5E13, and an implantation energy is in a range of 5 KEV-30 KEV.

7. The method for improving the FDSOI device leakage according to claim 1, wherein in step 4, the first and second STI regions are formed first, followed by performing the ion implantation on the bulk silicon region.

8. The method for improving the FDSOI device leakage according to claim 1, wherein devices formed in the bulk silicon region in step 5 comprise one or more of a Lateral Diffusion MOS (LDMOS), a diode, a resistor, a capacitor, and a substrate pick-up structure.

* * * * *